(12) United States Patent
Takata

(10) Patent No.: US 10,269,878 B2
(45) Date of Patent: *Apr. 23, 2019

(54) ORGANIC EL DISPLAY PANEL AND ORGANIC EL DISPLAY DEVICE

(71) Applicant: JOLED INC., Tokyo (JP)

(72) Inventor: Masakazu Takata, Tokyo (JP)

(73) Assignee: JOLED INC., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/709,717

(22) Filed: Sep. 20, 2017

(65) Prior Publication Data

US 2018/0033845 A1  Feb. 1, 2018

Related U.S. Application Data

(63) Continuation of application No. 15/123,390, filed as application No. PCT/JP2015/000887 on Feb. 23, 2015, now Pat. No. 9,799,711.

(30) Foreign Application Priority Data

Mar. 4, 2014 (JP) ................................ 2014-041595

(51) Int. Cl.
  *H01L 27/32* (2006.01)
  *H01L 51/00* (2006.01)

(52) U.S. Cl.
  CPC ...... *H01L 27/3246* (2013.01); *H01L 27/3218* (2013.01); *H01L 27/3283* (2013.01); *H01L 51/0004* (2013.01)

(58) Field of Classification Search
  CPC ............. H01L 27/3218; H01L 27/3246; H01L 27/3283; H01L 51/0004
  See application file for complete search history.

(56) References Cited

U.S. PATENT DOCUMENTS

| 5,443,922 A | 8/1995 | Nishizaki et al. |
| 2005/0237780 A1 | 10/2005 | Sakai |

(Continued)

FOREIGN PATENT DOCUMENTS

| CN | 101543136 A | 9/2009 |
| EP | 2151867 A1 | 2/2010 |

(Continued)

OTHER PUBLICATIONS

Notice of Allowance and Fees Due for U.S. Appl. No. 15/123,390, dated Jun. 20, 2017, 7 pages.

(Continued)

*Primary Examiner* — Allan R Wilson
(74) *Attorney, Agent, or Firm* — Chip Law Group

(57) ABSTRACT

An organic EL display panel includes plural streaks of first partition walls 16 on the upper side of an underlying layer 13 in such a manner that each of the plural streaks of the first partition walls 16 extends along a first direction, plural streaks of second partition walls 14 that are on the upper side of the underlying layer 13 in such a manner that each of the plural streaks of the second partition walls 14 extends along a second direction intersecting the first direction, and each have an upper surface 14a at a position lower than upper surfaces 16a of the first partition walls 16, and a light emitting layer 17 formed along the first direction on the upper side of the underlying layer 13 and in gaps 20 between the first partition walls 16 adjacent to each other in such a manner as to get over the plural streaks of the second partition walls 14. An organic EL display panel in which luminance unevenness is suppressed is thereby obtained.

13 Claims, 11 Drawing Sheets

(56) References Cited

U.S. PATENT DOCUMENTS

| | | |
|---|---|---|
| 2007/0159068 A1 | 7/2007 | Miyake |
| 2008/0070466 A1 | 3/2008 | Chu et al. |
| 2009/0039778 A1 | 2/2009 | Tomita |
| 2009/0160322 A1 | 6/2009 | Yoshida et al. |
| 2009/0284135 A1 | 11/2009 | Yoshida et al. |
| 2011/0025189 A1 | 2/2011 | Kidu et al. |
| 2012/0313509 A1 | 12/2012 | Takagi et al. |

FOREIGN PATENT DOCUMENTS

| | | |
|---|---|---|
| JP | 05-163488 A | 6/1993 |
| JP | 2002-075640 A | 3/2002 |
| JP | 2004-234901 A | 8/2004 |
| JP | 2009-043499 A | 2/2009 |
| JP | 2012-256587 A | 12/2012 |
| JP | 2013-206861 A | 10/2013 |
| JP | 2013-206864 A | 10/2013 |
| KR | 10-2009-0020644 A | 2/2009 |
| WO | 2008/146470 A1 | 12/2008 |
| WO | 2008/149499 A | 12/2008 |

OTHER PUBLICATIONS

Notice of Allowance and Fees Due for U.S. Appl. No. 15/123,390, dated Sep. 26, 2017, 2 pages.

International Preliminary Report on Patentability of PCT Application No. PCT/JP2015/000887, dated Sep. 6, 2016, 7 pages.

International Search Report and Written Opinion of PCT Application No. PCT/JP2015/000887, dated Sep. 11, 2015, 19 pages of ISRWO including English translation.

ORGANIC EL DISPLAY PANEL AND ORGANIC EL DISPLAY DEVICE

CROSS-REFERENCE TO RELATED APPLICATIONS

The present application is a continuation application of U.S. patent application Ser. No. 15/123,390, filed Sep. 2, 2016, which is a National Stage of PCT/JP2015/000887, filed Feb. 23, 2015, and claims the benefit of priority from prior Japanese Patent Application JP 2014-041595, filed Mar. 4, 2014. Each of the above-referenced applications is hereby incorporated herein by reference in its entirety.

TECHNICAL FIELD

The present invention relates to a display panel using organic electro luminescence (EL) elements and an organic EL display device including such an organic EL display panel, and particularly relates to a technique for suppressing luminance unevenness.

BACKGROUND ART

In recent years, studies and developments have been advanced regarding size increase of a display panel using organic EL elements. The organic EL element has a structure in which a light emitting layer composed of an organic compound is sandwiched by one pair of electrodes. The film thickness of this light emitting layer correlates with the light emission luminance and it is desirable that the film thickness in the pixel region of the display panel be even. For size increase of the display panel, many studies have been made on a method for uniformizing the film thickness of the light emitting layer in this pixel region.

Methods for forming the light emitting layer are roughly categorized into dry processes such as a vacuum evaporation method and wet processes such as an inkjet method. The wet processes are considered as techniques suitable for size increase of the display panel from the aspect of the formation accuracy thereof and the cost.

In the case of forming the light emitting layer by the wet process, generally partition walls (banks) are formed over a substrate in advance and the light emitting layer is formed in the pixel regions marked out by the partition walls. As the partition walls, there are two kinds of partition walls: pixel banks obtained by forming partition walls in a lattice manner and line banks obtained by forming plural streaks of partition walls extending along the column direction (for example, refer to PTL 1).

In the case of the line banks, a solution containing an organic compound serving as the material of the light emitting layer (hereinafter, referred to as "ink") can flow in the column direction in the gap between the partition walls. Thus, even when the amount of application of the ink varies in the column direction, film thickness unevenness among the pixel regions can be reduced due to the subsequent ink flow.

Incidentally, the ink generally has high surface tension. Therefore, if a foreign matter and a mass of ink whose drying has proceeded exist in the gap between the partition walls, the ink easily concentrates at the places where they exist. In particular, in the case of the line banks, because the ink can flow in the column direction, the ink easily concentrates from a wide range at the places where the foreign matter and the mass of ink exist and possibly large film thickness unevenness occurs in the column direction (refer to PTL 2).

Therefore, in an organic EL display panel of PTL 2, as shown in FIG. 14, in addition to plural streaks of first partition walls 916 extending along the column direction, plural streaks of second partition walls 914 extending along the row direction are further formed. Due to the formation of the second partition walls 914, the flow of ink applied to gaps 920 between the adjacent first partition walls 916 in the column direction is moderately suppressed and thus the ink concentrates less readily from a wide range at places where a foreign matter and a mass of ink exist. As a result, the occurrence of film thickness unevenness in the column direction is suppressed.

CITATION LIST

Patent Literatures

[PTL 1]
Japanese Patent Laid-open No. 2002-75640
[PTL 2]
Japanese Patent Laid-open No. 2009-43499

SUMMARY

Technical Problem

However, in the case of the above-described configuration, a situation possibly occurs in which the ink that is applied to the gaps 920 between the adjacent first partition walls 916 and is in the middle of drying becomes discontinuous (non-wetted part is caused) on the second partition walls 914 having lower lyophilicity than an underlying layer 913. If the ink becomes discontinuous on the second partition wall 914, the ink existing on the second partition wall 914 flows into one of both adjacent pixel regions 921. Thus, the amount of ink applied to these pixel regions 921 becomes uneven. In this case, the film thickness of light emitting layers 917 formed after ink drying is not constant in the pixel regions 921 and luminance unevenness when the panel is turned on is observed due to the difference in the film thickness.

Therefore, an object of the present invention is to provide an organic EL display panel in which luminance unevenness is suppressed and an organic EL display device including such an organic EL display panel.

Solution to Problem

An organic EL display panel according to one aspect of the present invention includes a substrate, an underlying layer formed on the upper side of the substrate, and a plurality of streaks of first partition walls juxtaposed on the upper side of the underlying layer in such a manner that each of the plurality of streaks of the first partition walls extends along a first direction. The organic EL display panel further includes a plurality of streaks of second partition walls that are juxtaposed on the upper side of the underlying layer in such a manner that each of the plurality of streaks of the second partition walls extends along a second direction intersecting the first direction, and each have an upper surface at a position lower than upper surfaces of the first partition walls, and a light emitting layer formed along the first direction on the upper side of the underlying layer and in gaps between the first partition walls adjacent to each other in such a manner as to get over the plurality of streaks of the second partition walls. Furthermore, a coat having higher lyophilicity than the second partition walls is formed at least on the upper surfaces of the second partition walls.

Advantageous Effect of Invention

In the organic EL display panel according to the above-described aspect, the coat having higher lyophilicity than the second partition walls is formed at least on the upper surfaces of the second partition walls and thus luminance unevenness is suppressed.

BRIEF DESCRIPTION OF DRAWINGS

FIG. 9(a) is a diagram showing an underlying layer forming step, FIG. 9(b) is a diagram showing a second partition wall forming step, FIG. 9(c) is a diagram showing a coat forming step, FIG. 9(d) is a diagram showing a first partition wall forming step, FIG. 9(e) is a diagram showing an ink applying step, and FIG. 9(f) is a diagram showing an ink drying step.

FIG. 10(a) is a diagram showing the underlying layer forming step, FIG. 10(b) is a diagram showing the second partition wall forming step, FIG. 10(c) is a diagram showing the coat forming step, FIG. 10(d) is a diagram showing the first partition wall forming step, FIG. 10(e) is a diagram showing the ink applying step, and FIG. 10(f) is a diagram showing the ink drying step.

DESCRIPTION OF EMBODIMENTS

Figure 1:
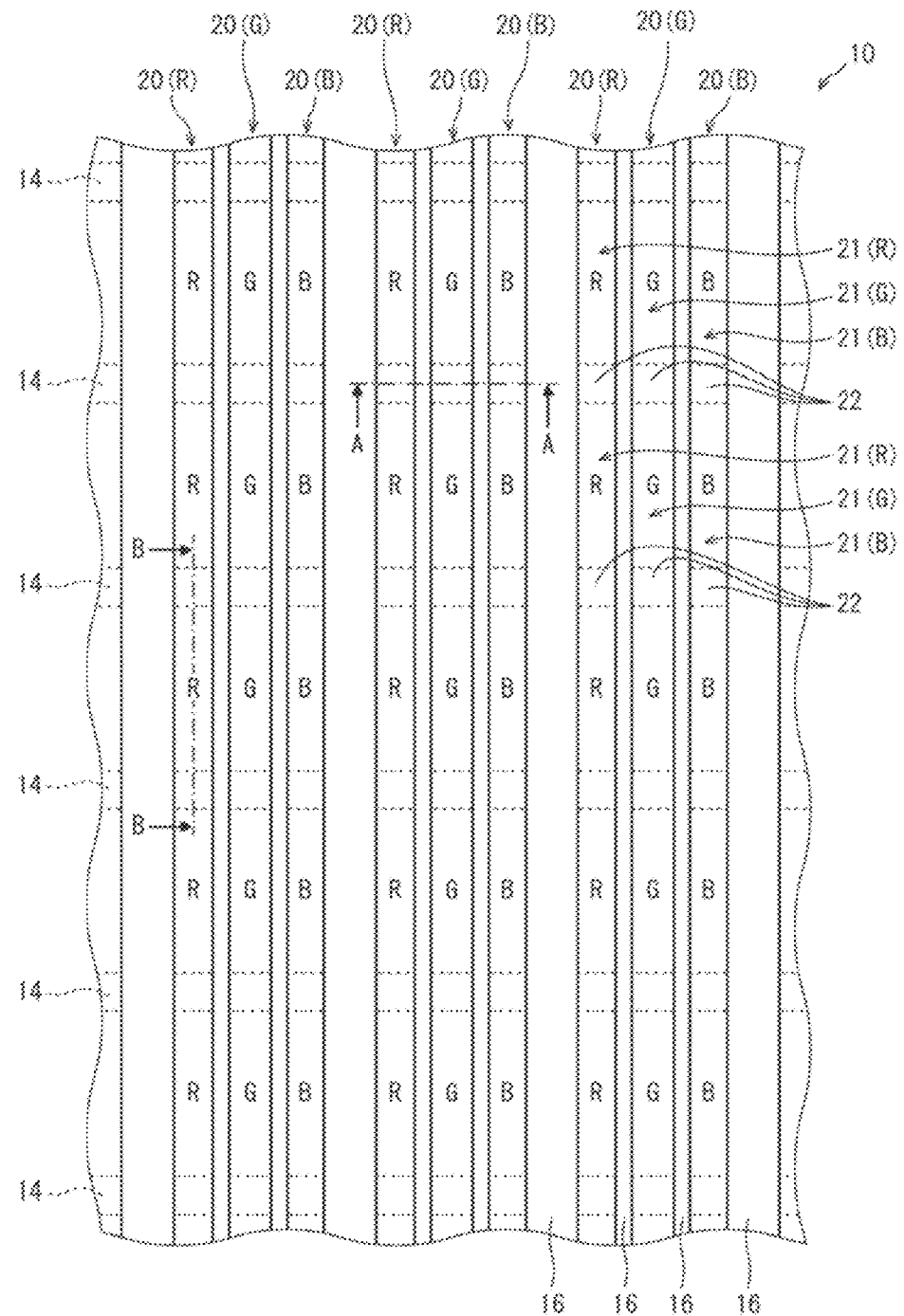
FIG. 1 is a schematic plan view showing part of an organic EL display panel according to embodiment 1.

An organic EL display panel according to one aspect of the present invention includes a substrate, an underlying layer formed on the upper side of the substrate, and a plurality of streaks of first partition walls juxtaposed on the upper side of the underlying layer in such a manner that each of the plurality of streaks of the first partition walls extends along a first direction. The organic EL display panel further includes a plurality of streaks of second partition walls that are juxtaposed on the upper side of the underlying layer in such a manner that each of the plurality of streaks of the second partition walls extends along a second direction intersecting the first direction, and each have an upper surface at a position lower than upper surfaces of the first partition walls, and a light emitting layer formed along the first direction on the upper side of the underlying layer and in gaps between the first partition walls adjacent to each other in such a manner as to get over the plurality of streaks of the second partition walls. Furthermore, a coat having higher lyophilicity than the second partition walls is formed at least on the upper surfaces of the second partition walls. According to this configuration, the ink that is applied to the gaps between the first partition walls and is in the middle of drying remains on the upper side of the second partition walls more readily. Thus, the light emitting layer becomes discontinuous on the upper side of the second partition walls less readily. Therefore, luminance unevenness is suppressed.

Furthermore, in the organic EL display panel according to another aspect of the present invention, the coat has higher lyophilicity than the underlying layer or has lyophilicity comparable to the lyophilicity of the underlying layer. According to this configuration, the ink in the middle of drying becomes discontinuous less readily at the boundary parts between the underlying layer and the second partition walls. Thus, luminance unevenness is further suppressed.

In addition, in the organic EL display panel according to another aspect of the present invention, the underlying layer contains tungsten oxide. Moreover, in the organic EL display panel according to another aspect of the present invention, the light emitting layer is formed by applying ink containing an organic material into the gaps and drying the ink, and the contact angle of an upper surface of the coat with respect to the ink is equal to or smaller than 3°. If tungsten oxide is contained in the underlying layer, the contact angle of an upper surface of the underlying layer with respect to the ink is approximately 3°. Thus, if the contact angle of the upper surface of the coat with respect to the ink is set equal to or smaller than 3°, the coat having higher lyophilicity than the underlying layer or the coat having lyophilicity comparable to the lyophilicity of the underlying layer can be obtained. Therefore, luminance unevenness is suppressed more surely.

Moreover, in the organic EL display panel according to another aspect of the present invention, the coat is continuously formed on the second partition walls and on the underlying layer along the first direction in the gaps. According to this configuration, in the gaps between the first partition walls, the lyophilicity of the pixel regions (regions between the second partition walls) can be set identical to that of the inter-pixel regions (regions over the second partition walls).

Furthermore, in the organic EL display panel according to another aspect of the present invention, the coat is formed only on the second partition walls in the gaps. According to this configuration, only the lyophilicity of the upper side of the second partition walls can be enhanced and thus the ink remains on the upper side of the second partition walls more readily relatively.

In addition, an organic EL display device according to another aspect of the present invention includes the above-described organic EL display panel. In the organic EL display device according to the above-described aspect, high display quality is realized because the organic EL display panel in which luminance unevenness is suppressed is included.

In the present application, "upper side" does not refer to the upper direction (vertical upper side) in absolute spatial recognition and is defined based on a relative positional relationship on the basis of the order of layer stacking in a layer-stacked configuration. Furthermore, the term "upper side" is applied to not only the case in which an interval is set between relevant elements but also the case in which the relevant elements are in tight contact with each other.

[Embodiment 1]

In the following, an organic EL display panel according to embodiment 1 as one aspect of the present invention will be described by using the drawings. The drawings are schematic diagrams and the scale thereof is different from the actual scale in some cases.

<Schematic Configuration of Organic EL Display Panel>

FIG. 1 is a schematic plan view showing part of the organic EL display panel according to embodiment 1. As shown in FIG. 1, an organic EL display panel 10 (hereinafter, referred to as the "panel 10") is an organic EL display panel using an electroluminescence phenomenon of an organic compound. In the panel 10, line banks are employed and plural first partition walls 16 whose respective streaks extend along the column direction (upward-downward direction in the plane of paper of FIG. 1) as a first direction are juxtaposed. Furthermore, when each of regions between the adjacent first partition walls 16 is defined as a gap 20, the panel 10 has a configuration in which large numbers of such first partition walls 16 and gaps 20 are alternately arranged.

In each of the gaps 20, plural pixel regions 21 and plural inter-pixel regions 22 that are regions between the adjacent pixel regions 21 are alternately lined up in the column direction. Furthermore, in the plural inter-pixel regions 22 in the gap 20, plural second partition walls 14 whose respective streaks extend along the row direction (left-right direction in the plane of paper of FIG. 1) as a second direction are juxtaposed. The first partition walls 16 provided along the column direction are orthogonal to the second partition walls 14 provided along the row direction.

In the present embodiment, as the pixel regions 21, red pixel regions 21R that emit light in red, green pixel regions 21G that emit light in green, and blue pixel regions 21B that emit light in blue exist. Furthermore, as the gaps 20, red gaps 20R whose inside pixel regions 21 are all the red pixel regions 21R, green gaps 20G whose inside pixel regions 21 are all the green pixel regions 21G, and blue gaps 20B whose inside pixel regions 21 are all the blue pixel regions 21B exist. Moreover, three pixel regions 21 of the red pixel region 21R, the green pixel region 21G, and the blue pixel region 21B are lined up in the row direction and form a group to configure one pixel.

<Configurations of Respective Parts of Organic EL Display Panel>

Figure 2:
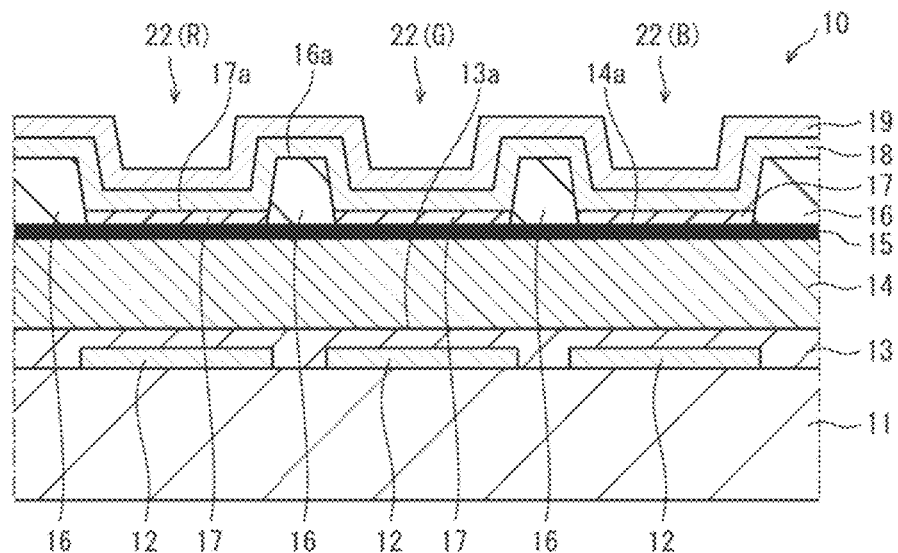
FIG. 2 is a sectional schematic diagram along line A-A in FIG. 1.
Figure 3:
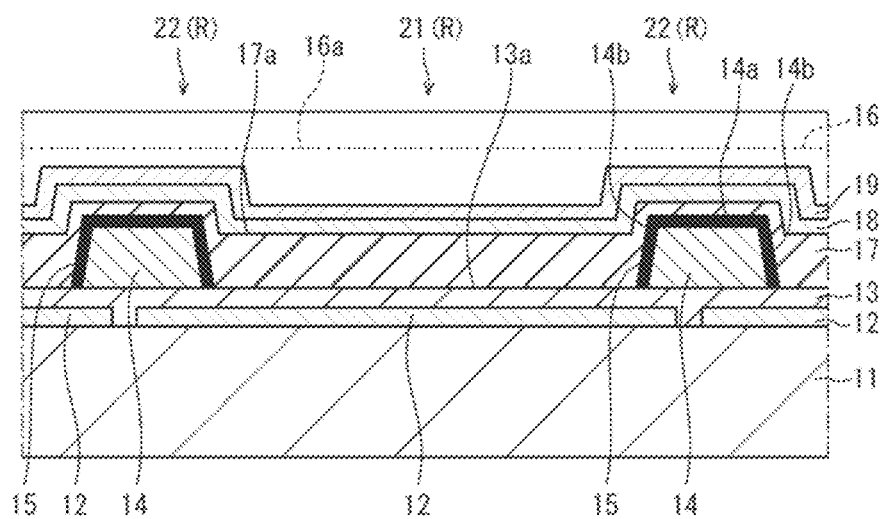
FIG. 3 is a sectional schematic diagram along line B-B in FIG. 1.

The configurations of the respective parts of the panel 10 will be described by using FIG. 2 and FIG. 3. FIG. 2 is a sectional schematic diagram along line A-A in FIG. 1. FIG. 3 is a sectional schematic diagram along line B-B in FIG. 1.

As the panel 10, a so-called top-emission type in which the display surface exists on the upper side of the plane of paper of FIG. 2 and FIG. 3 is employed as one example. In the following, description will be made, with the upper side of the plane of paper of FIG. 2 and FIG. 3 deemed as the upper side of the panel 10.

The panel 10 includes a substrate 11, pixel electrodes 12, an underlying layer 13, the second partition walls 14, coats 15, the first partition walls 16, light emitting layers 17, a counter electrode 18, and a sealing layer 19.

(Substrate)

The substrate 11 has a base (not shown), a thin film transistor (TFT) layer (not shown) formed over the base, and an interlayer insulating layer (not shown) formed over the base and over the TFT layer.

The base is a support member of the panel 10 and has a flat plate shape. As the material of the base, a material having the electrical insulation property, e.g. a glass material, a resin material, a semiconductor material, a metal material coated with an insulating layer, or the like, can be used.

The TFT layer is formed of plural TFTs and interconnects formed on the upper surface of the base. The TFT electrically connects the pixel electrode 12 corresponding to this TFT to an external power supply according to a drive signal from an external circuit of the panel 10 and is formed of a multilayer structure of electrodes, semiconductor layers, insulating layers, and so forth. The interconnects electrically connect the TFTs, the pixel electrodes 12, the external power supply, the external circuit, and so forth.

The interlayer insulating layer planarizes at least the pixel regions 21 in the upper surface of the substrate 11, in which recesses and projections exist due to the TFT layer. Furthermore, the interlayer insulating layer fills spaces among the interconnects and the TFTs and electrically insulate the interconnects and the TFTs from each other. As the material of the interlayer insulating layer, e.g. a positive photosensitive organic material having the electrical insulation property, specifically an acrylic-based resin, a polyimide-based resin, a siloxane-based resin, a phenol-based resin, or the like, can be used.

(Pixel Electrodes)

The pixel electrodes 12 are electrodes for supplying carriers to the light emitting layers 17, and supply holes to the light emitting layers 17 when functioning as anodes for example. The shape of the pixel electrodes 12 is a flat plate shape. However, for example, if a connection to the TFT is made through a contact hole opened in the interlayer insulating layer, the pixel electrodes 12 have a recess-projection part along the contact hole. In each of the gaps 20, the pixel electrodes 12 are disposed on the substrate 11 at intervals in the column direction.

Because the panel 10 is a top-emission type, it is preferable to use an electrically-conductive material having light reflectivity, e.g. a metal such as silver, aluminum, and molybdenum, an alloy using them, or the like, as the material of the pixel electrodes 12.

(Underlying Layer)

The underlying layer 13 is a hole injection layer in the present embodiment for example. The underlying layer 13 is formed as a continuous blanket film on the upper side of the pixel electrodes 12 and electrically insulates the adjacent pixel electrodes 12 from each other. If the underlying layer 13 is formed as a continuous blanket film as above, simplification of the manufacturing step can be achieved.

Furthermore, the underlying layer 13 is composed of a transition metal oxide and functions as the hole injection layer. Here, the transition metal is an element existing in the range from group III elements to group XI elements in the periodic table. Among the transition metals, tungsten, molybdenum, nickel, titanium, vanadium, chromium, manganese, iron, cobalt, niobium, hafnium, tantalum, and so forth are preferable because having a high hole injection property after being oxidized. In particular, tungsten is suitable to form a hole injection layer having a high hole injection property. The underlying layer 13 is not limited to the case of being composed of a transition metal oxide and may be composed of an oxide other than the transition metal oxide, such as an alloy of a transition metal, for example. Furthermore, the underlying layer 13 is not limited to the hole injection layer and may be any layer as long as it is a layer formed between the pixel electrodes 12 and the light emitting layers 17.

(Second Partition Walls)

The second partition walls 14 are components configured to suppress the flow of ink containing an organic component serving as the material of the light emitting layers 17 in the column direction at the time of formation of the light emitting layers 17. The shape of the second partition walls 14 is a linear shape extending along the row direction and the section along the column direction has a forward tapered trapezoidal shape whose upper side is tapered. The second partition walls 14 are provided in the state of being along the row direction orthogonal to the column direction in such a manner as to penetrate the respective first partition walls 16. Each of the second partition walls 14 has an upper surface 14a at a lower position than upper surfaces 16a of the first partition walls 16.

As the material of the second partition walls 14, a material having the electrical insulation property, e.g. an inorganic material such as silicon oxide and silicon nitride and an organic material such as an acrylic-based resin, a polyimide-based resin, a siloxane-based resin, and a phenol-based resin, can be used.

(Coats)

The coats 15 are components configured to prevent the light emitting layer 17 from becoming discontinuous on the upper side of the second partition wall 14 and are formed on the second partition walls 14. Specifically, as shown in FIG. 3, in the gap 20, the coats 15 are formed on the upper surfaces 14a and side surfaces 14b of the second partition walls 14 existing in the inter-pixel regions 22 and are not formed on an upper surface 13a of the underlying layer 13 existing in the pixel regions 21.

As the material of the coats 15, an application-type material of an organic functional layer or the like can be used. For example, a hole injection material of an application type, such as poly(3,4-ethylenedioxythiophene)polystyrene sulfonate (PEDOT:PSS), can be used. For example, the coats 15 are formed by applying ink obtained by dissolving an application-type material of an organic functional layer in a solvent on the upper surfaces 14a and the side surfaces 14b of the second partition walls 14 and drying the ink.

As the ink for the coats 15, ink having favorable wettability with respect to the surface of the second partition wall 14 (upper surface 14a and side surface 14b) is preferable. Furthermore, as the material of the coats 15, a material having favorable wettability with respect to ink for the layer formed on the coats 15 (for example, ink for the light emitting layers 17 or ink for an interlayer (CHB: cyclohexylbenzene)) is preferable. Moreover, if the material of the second partition walls 14 is an organic material, it is preferable that a polar solvent be used for the ink for the coats 15. This is because, when the material of the second partition walls 14 is an organic material, hydroxyl groups exist in the surfaces of the second partition walls 14 and thus the use of a polar solvent improves the wettability.

The coats 15 are formed of a material having higher lyophilicity than the material of the second partition walls 14 and has higher lyophilicity than the second partition walls 14. Therefore, a configuration in which the light emitting layer 17 becomes discontinuous less readily on the upper side of the second partition wall 14 is provided. This point will be described later.

(First Partition Walls)

The first partition walls 16 are components configured to restrict the flow of ink in the row direction in the gap 20 at the time of formation of the light emitting layers 17. The shape of the first partition walls 16 is a linear shape extending along the column direction and the section along the row direction has a forward tapered trapezoidal shape whose upper side is tapered. The first partition walls 16 are formed on the underlying layer 13 in such a manner as to sandwich the respective pixel electrodes 12 from the row direction and get over the respective second partition walls 14.

As the material of the first partition walls 16, e.g. an organic material such as an acrylic-based resin, a polyimide-based resin, a siloxane-based resin, and a phenol-based resin, or the like can be used. It is preferable that the first partition walls 16 be formed of a material that has resistance against the organic solvent and is not excessively deformed, altered, and so forth against etching treatment and baking treatment. Furthermore, the surfaces of the first partition walls 16 may be subjected to fluorine treatment so that the surfaces may be caused to have lyophobicity.

(Light Emitting Layers)

The light emitting layers 17 are layers composed of an organic compound and have a function of emitting light through the recombination of holes and electrons inside the light emitting layers 17. Each light emitting layer 17 is formed into a linear shape to extend along the column direction in the gap 20. Each light emitting layer 17 is located on the underlying layer 13 in the pixel region 21 and is located on the coat 15 in the inter-pixel region 22.

Here, in the light emitting layers 17, only the parts to which carriers are supplied from the pixel electrodes 12 emit light. Therefore, as shown in FIG. 3, in the light emitting layers 17, only the parts in the pixel regions 21 existing above the pixel electrodes 12 emit light whereas the parts in the inter-pixel regions 22 existing above the second partition walls 14 do not emit light.

As shown in FIG. 3, the light emitting layers 17 are extended not only in the pixel regions 21 but also to the adjacent inter-pixel regions 22. If this is done, at the time of formation of the light emitting layers 17, the ink applied to the pixel regions 21 can flow in the column direction through the ink applied to the inter-pixel regions 22 and the film thickness thereof can be leveled among the pixel regions 21 of the column direction. However, in the inter-pixel regions 22, the flow of the ink is moderately suppressed by the second partition walls 14. Thus, large film thickness unevenness occurs less readily in the column direction.

As the material of the light emitting layers 17, a luminescent organic material that can be deposited by using a wet process is used. Specifically, e.g. a publicly-known fluorescent substance or phosphorescent substance, such as compounds, derivatives, and complexes described in a patent publication bulletin (Japanese Patent Laid-open No. 1993-163488), can be used.

(Counter Electrode)

The counter electrode 18 makes pairs with the pixel electrodes 12 to sandwich the light emitting layers 17 to thereby make current application paths and supply carriers to the light emitting layers 17. The counter electrode 18 supplies electrons to the light emitting layers 17 when functioning as a cathode for example. The counter electrode 18 is formed along upper surfaces 17a of the respective light emitting layers 17 and the surfaces of the respective first partition walls 16 exposed from the light emitting layers 17 and is an electrode common to the respective light emitting layers 17.

Because the panel 10 is a top-emission type, an electrically-conductive material having optical transparency is used as the material of the counter electrode 18. For example, indium tin oxide (ITO), indium zinc oxide (IZO), or the like can be used.

(Sealing Layer)

The sealing layer 19 is a component configured to suppress the deterioration of the light emitting layers 17 due to contact with water, air, and so forth. The sealing layer 19 is provided over the whole surface of the panel 10 to cover the upper surface of the counter electrode 18. Because the panel 10 is a top-emission type, e.g. an optically-transparent material such as silicon nitride and silicon oxynitride is used as the material of the sealing layer 19.

(Others)

Although not shown in FIG. 2 and FIG. 3, a color filter and an upper substrate may be set and joined over the sealing layer 19. This allows adjustment of the display color of the panel 10, improvement in the rigidity, prevention of entry of water, air, etc., and so forth.

<Configuration of Major Part of Organic EL Display Panel>

Figure 4:
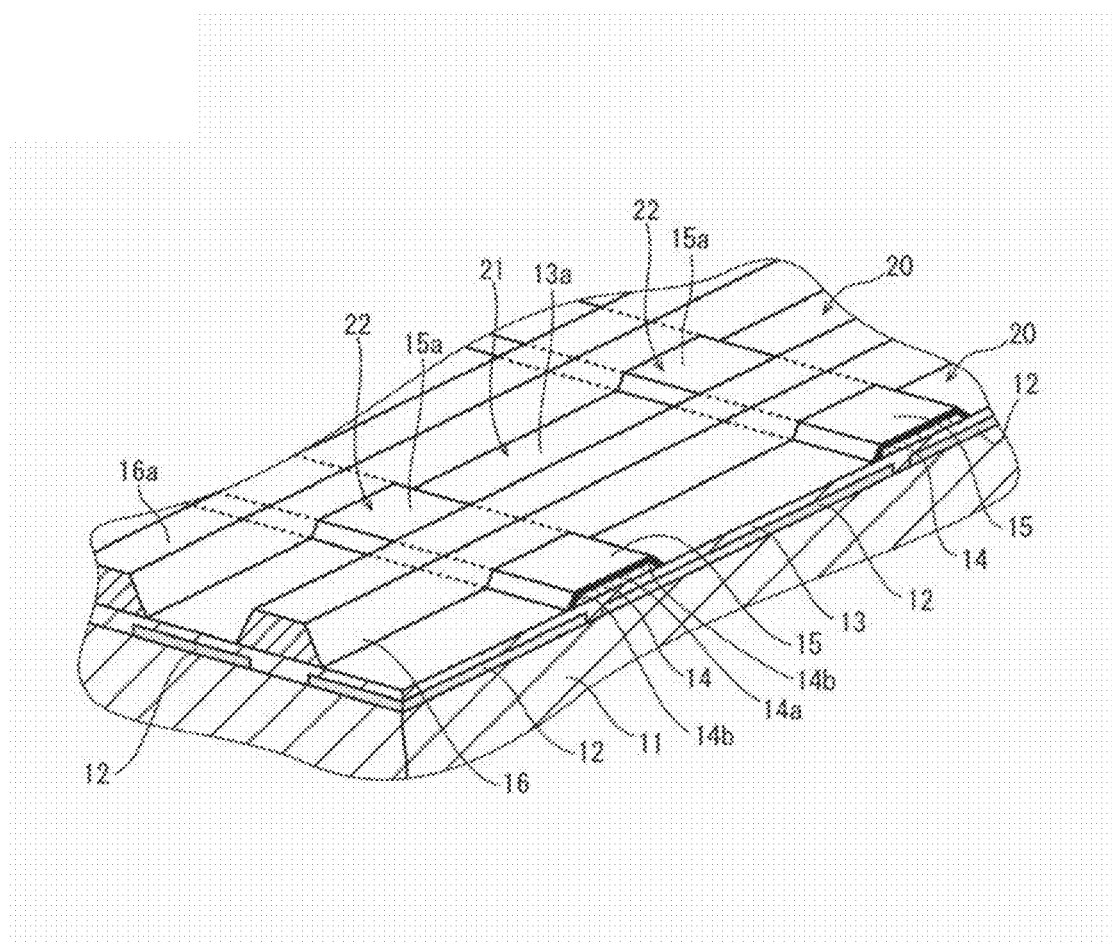
FIG. 4 is a schematic perspective view showing the structure of the organic EL display panel before light emitting layers are formed.
Figure 5:
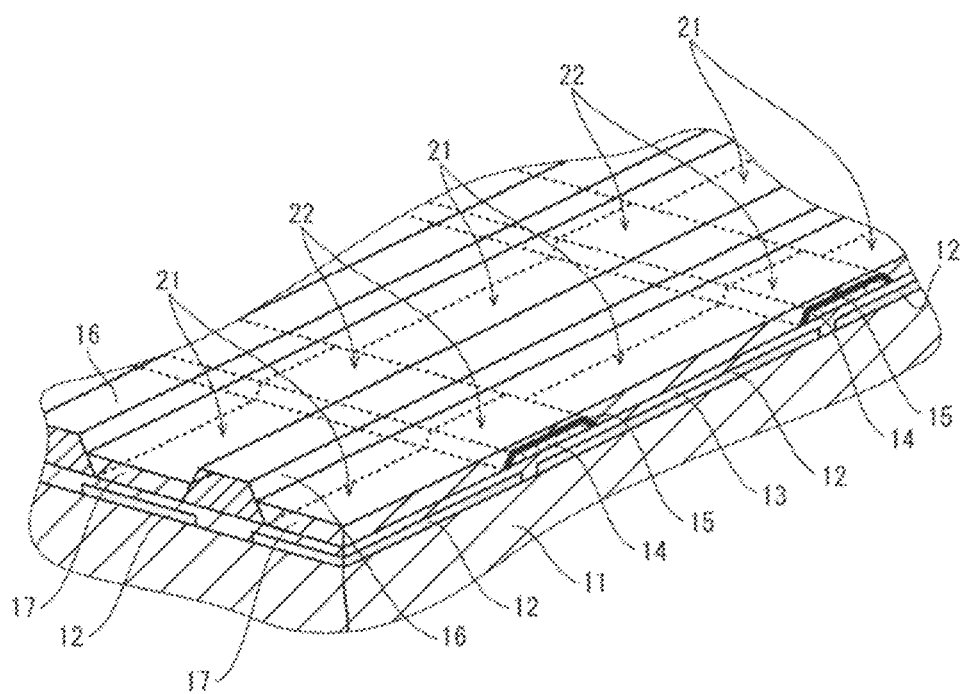
FIG. 5 is a schematic perspective view showing the structure of the organic EL display panel after the light emitting layers are formed.

The configuration of the major part of the panel 10 will be described by using FIG. 4 and FIG. 5. FIG. 4 is a schematic perspective view showing the structure of the organic EL display panel before the light emitting layers are formed. FIG. 5 is a schematic perspective view showing the structure of the organic EL display panel after the light emitting layers are formed.

As described above, the coats 15 whose lyophilicity is higher than the second partition walls 14 are formed on the second partition walls 14. Here, that the lyophilicity is high means that the affinity with the ink of the light emitting layers 17 is high, i.e. the wettability with respect to the ink is favorable.

Because the lyophilicity of the coats 15 is higher than that of the second partition walls 14, the lyophilicity of upper surfaces 15a of the coats 15 is higher than that of the upper surfaces 14a of the second partition walls 14. Therefore, the upper surfaces 15a of the coats 15 have more favorable wettability with respect to the ink than the upper surfaces 14a of the second partition walls 14.

Figure 14:
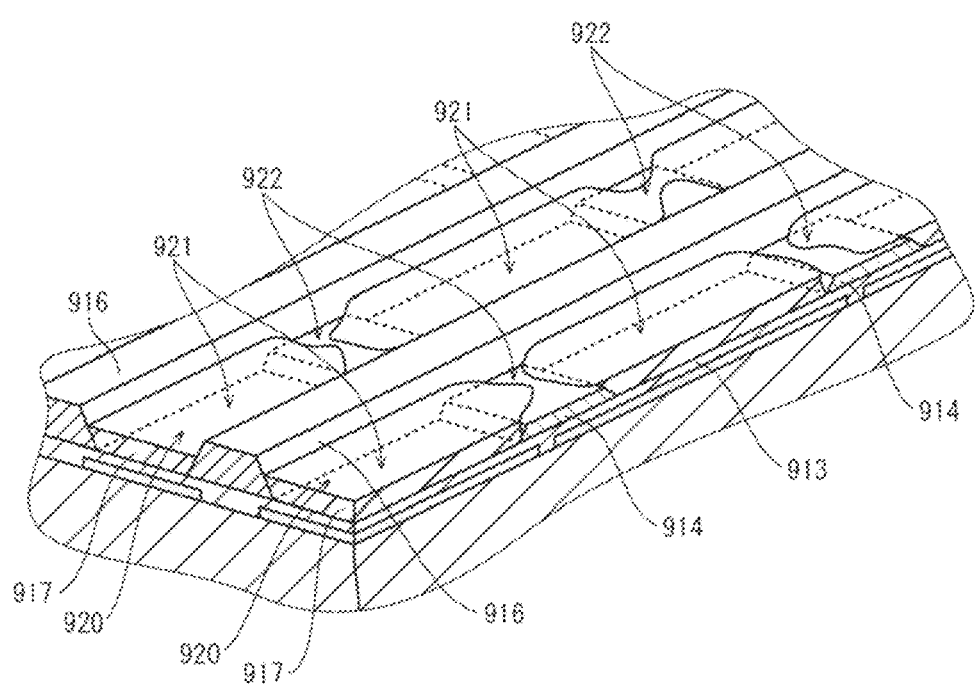
FIG. 14 is a schematic perspective view for explaining a cause of the occurrence of film thickness unevenness in a conventional organic EL display panel.

In the case of the conventional panel, coats are not formed on the second partition walls 914 as shown in FIG. 14. Therefore, the lyophilicity of inter-image regions 922 is low and the wettability is also unfavorable. Thus, ink that is applied to the gaps 20 between the first partition walls 16 and is in the middle of drying is repelled by upper surfaces 914a of the second partition walls 914. In this case, the ink becomes discontinuous on the upper surfaces 914a of the second partition walls 914. As a result, the light emitting layers 917 also become discontinuous on the upper surfaces 914a of the second partition walls 914.

In the case of the panel 1 according to embodiment 1, as shown in FIG. 4, the coats 15 having higher lyophilicity than the second partition walls 14 is formed on the upper surfaces 14a of the second partition walls 14 before the light emitting layers 17 are formed. Thus, the wettability of the inter-pixel regions 22 is improved by the coats 15. For this reason, the ink that is applied to the gaps 20 between the first partition walls 16 and is in the middle of drying remains in the inter-pixel regions 22 more readily and the state in which the ink in the adjacent pixel regions 21 is continuous in the wet state can be kept. Consequently, the light emitting layers 17 become discontinuous less readily in the inter-pixel regions 22 on the upper side of the second partition walls 14. As a result, an even amount of liquid can be applied to each pixel region 21 and the light emitting layers 17 having an even film thickness can be obtained.

The whole of the upper surfaces 17a of the light emitting layers 17 formed in this manner is flat irrespective of whether the place is the pixel region 21 or the inter-pixel region 22. Therefore, the film thickness of the light emitting layers 17 in the pixel regions 21 is also even. That is, an equivalent amount of ink is applied to each pixel region 21 as planned and the amount of application is sufficiently leveled among the pixel regions 21. Because the amount of application is the same, the film thickness of the light emitting layers 17 in the respective pixel regions 21 is even.

By the above-described configuration, luminance unevenness when the panel is turned on is suppressed. For example, in the respective pixels of RGB, the film thickness of the light emitting layer of each color is often varied for optical adjustment and so forth. The above-described configuration is particularly effective in such a case. This is because a situation in which the film thickness cannot help but be set considerably small depending on the color readily occurs because of the optical adjustment and, in the color, the amount of application of the ink is small and therefore the light emitting layer 17 readily becomes discontinuous.

In the panel 10, it is preferable that the lyophilicity of the second partition walls 14 be higher than the lyophilicity of the first partition walls 16. If so, the occurrence of the discontinuity of the ink and film thickness unevenness in the pixel regions 21 can be suppressed. In general, the lyophilicity is set low in the surfaces of the first partition walls 16 in many cases (lyophobicity is set high in many cases) so that the ink may be prevented from flowing over the first partition wall 16. At this time, if the lyophilicity of the surfaces of the second partition walls 14 is equivalent to or lower than that of the surfaces of the first partition walls 16, the ink spreads less readily to the place at which the surface of the second partition wall 14 is joined to the surface of the first partition wall 16, which becomes a cause of the occurrence of the discontinuity of the ink and film thickness unevenness in the pixel regions 21.

(Evaluation of Film Discontinuity)

The effect of suppressing the discontinuity of the light emitting layer 17 by the coat 15 was evaluated by an experiment.

Figure 6:
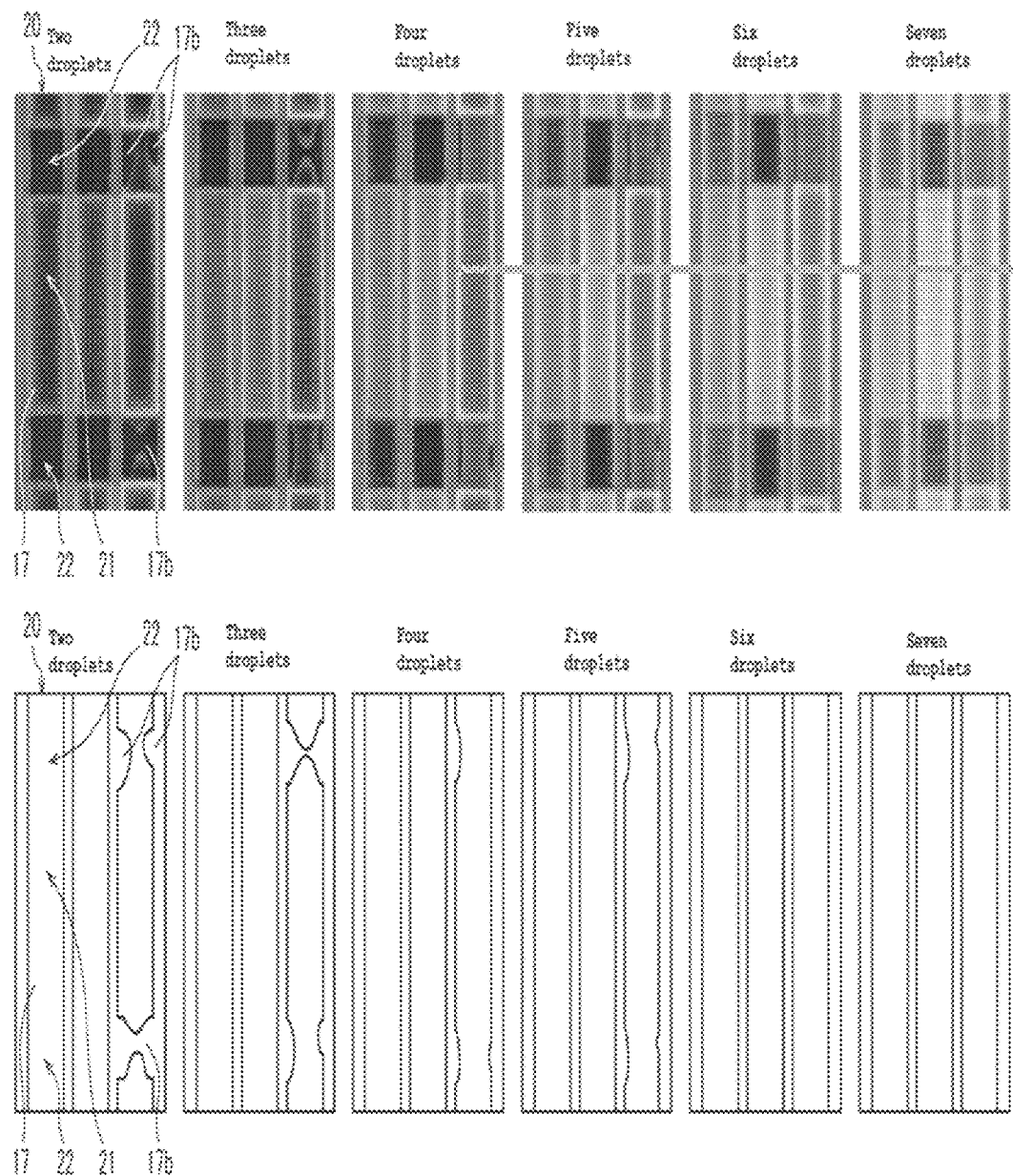
FIG. 6 is a diagram for explaining an effect of suppressing the discontinuity of the light emitting layer by a coat.

FIG. 6 is a diagram for explaining the effect of suppressing the discontinuity of the light emitting layer by the coat. In FIG. 6, on the upper row, photographic images obtained by photographing the substrate 11 after formation of the light emitting layers 17 from above are displayed. The six photographic images on the upper row are the cases in which the light emitting layers 17 were formed by applying ink to the pixel regions 21 by two droplets, three droplets, four droplets, five droplets, six droplets, or seven droplets from the left sequentially.

Furthermore, in each of the photographic images on the upper row, the light emitting layers 17 in three pixel regions 21 adjacent in the row direction appear. The left two among them are the light emitting layers 17 for which the coats 15 are formed in the inter-pixel regions 22 located on both sides (upper side and lower side) of the pixel region 21. The remaining right one is the light emitting layer 17 for which the coats 15 are not formed in the inter-pixel regions 22. That is, the effect by the coat 15 can be understood when the state of the light emitting layer 17 in the inter-pixel regions 22 is compared between the left two and the right one.

Furthermore, in FIG. 6, on the lower row, the contours of the light emitting layers 17 understood from the photographic images on the upper row are traced and displayed. The sample in which defect parts 17b exist in the light emitting layer 17 in the inter-pixel regions 22 is a sample in which discontinuity occurred in the light emitting layer 17 because the wettability of the inter-pixel regions 22 was low or a sample in which the width of the light emitting layer 17 became small although discontinuity did not occur.

As shown in FIG. 6, when two to five droplets of the ink were applied, the defect parts 17b were generated in the light emitting layer 17 in the inter-pixel regions 22 in which the coats 15 were not formed. Moreover, when two or three droplets of the ink were applied, the discontinuity of the light emitting layer 17 occurred in the inter-pixel region 22 in which the coat 15 was not formed.

On the other hand, when the coats 15 were formed in the inter-pixel regions 22, the discontinuity of the light emitting layer 17 did not occur even when the amount of application was two droplets.

From the above result, it turns out that forming the coats 15 on the second partition walls 14 can suppress the discontinuity of the light emitting layer 17 in the inter-pixel regions 22 even when the amount of application of the ink is small.

(Measurement of Contact Angle)

The wettability with respect to ink can be evaluated by measuring the contact angle with respect to the ink.

Figure 7:
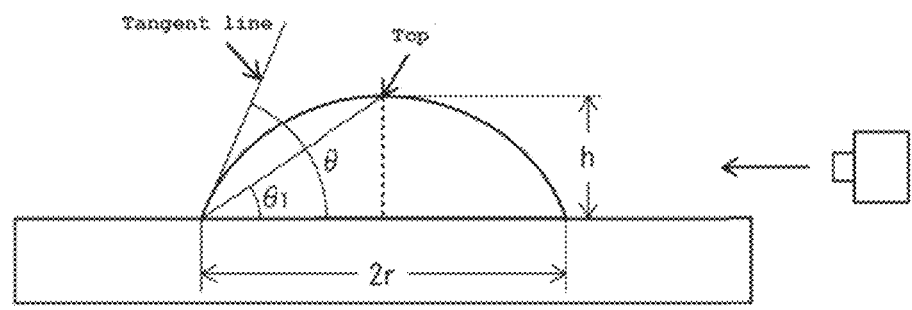
FIG. 7 is a diagram for explaining a measurement method of the contact angle with respect to ink.

FIG. 7 is a diagram for explaining a measurement method of the contact angle with respect to ink. In the measurement of the contact angle with respect to ink, first, as shown in FIG. 7, a layer whose wettability is desired to be evaluated is formed on a substrate or the like. Then, 0.5 to 1.0 µl of the ink is dropped onto the upper surface of the layer and the state of the droplet is observed by a camera from the horizontal direction. Next, the radius r of the bottom surface of the droplet and the height h of the droplet (distance in the vertical direction from the upper surface of the layer to the top of the droplet) are measured from an obtained image, and these radius r and height h are substituted into the following expression 1 to obtain an angle θ1. Then, a value twice the angle θ1 is employed as a contact angle θ as shown by expression 2.

$$\theta 1 = \tan^{-1}(h/r) \qquad \text{Expression 1}$$

$$\theta = \theta 1 \times 2 \qquad \text{Expression 2}$$

The wettability can be evaluated to be higher when the contact angle is smaller. Furthermore, the lyophilicity can be evaluated to be higher when the contact angle is smaller.

(Evaluation of Wettability)

To confirm the effect by the coat 15 and an effect of carrying out ultraviolet (UV) irradiation and baking treatment to be described later, samples 1 to 3 were fabricated and the wettability of the inter-pixel region 22 of each sample was evaluated.

As sample 1, a semi-manufactured product of the panel 1 according to embodiment 1 before the first partition walls 16 and the light emitting layers 17 were formed was fabricated. In sample 1, the UV irradiation and the baking treatment were carried out on the second partition walls 14 in order to decrease the contact angle. Furthermore, the coats 15 were formed on the second partition walls 14 in order to further decrease the contact angle.

As sample 2, a sample was fabricated that was a semi-manufactured product before the first partition walls 16 and the light emitting layers were formed as with sample 1 but in which the coats 15 were not formed on the second partition walls 14. In sample 2, the UV irradiation and the baking treatment were carried out on the second partition walls 14 similarly to sample 1. However, the coats 15 were not formed differently from sample 1.

As sample 3, a sample was fabricated that was a semi-manufactured product before the coats 15 were formed and in which the UV irradiation and the baking treatment were not carried out on the second partition walls 14. In sample 3, differently from sample 1, the UV irradiation and the baking treatment were not carried out on the second partition walls 14. Moreover, the coats 15 were also not formed.

For the evaluation of the wettability, the contact angle with respect to ink was measured by the above-described method and it was determined that the wettability was higher when the contact angle was smaller.

Figure 8:
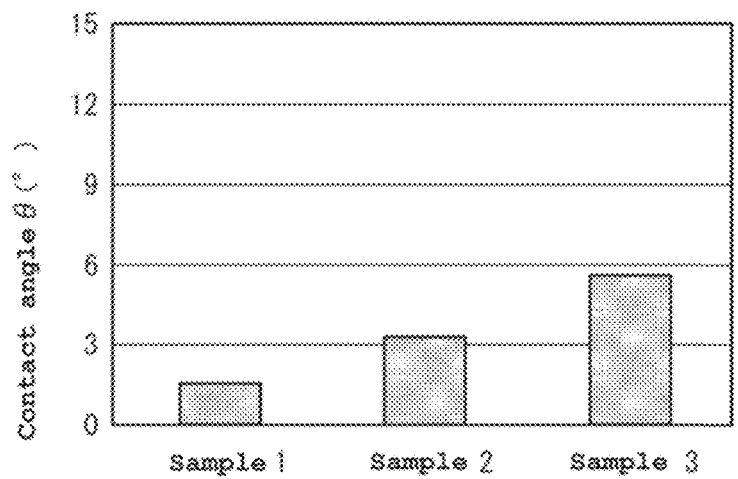
FIG. 8 is a diagram showing a measurement result of the contact angle.

FIG. 8 is a diagram showing the measurement result of the contact angle. As shown in FIG. 8, the contact angle of sample 3 was 5.9° whereas the contact angle of sample 2 was 3.1°. Thus, the wettability of sample 2 was higher than sample 3. The difference between sample 3 and sample 2 was whether or not the UV irradiation and the baking treatment were carried out on the second partition walls 14. Therefore, it could be confirmed that the wettability is enhanced by carrying out the UV irradiation and the baking treatment.

Furthermore, the contact angle of sample 1 was 1.5° and was smaller than the contact angle of sample 2. From this, it could be confirmed that the wettability is further enhanced by forming the coat 15.

<Manufacturing Method of Organic EL Display Panel>

A manufacturing method of the panel 10 will be described by using FIGS. 9(a), 9(b), 9(c), 9(d), 9(e), 9(f), 10(a), 10(b), 10(c), 10(d), 10(e) and 10(f). FIGS. 9(a), 9(b), 9(c), 9(d), 9(e) and 9(f) are sectional schematic diagrams along line A-A showing manufacturing steps of the organic EL display panel. FIGS. 10(a), 10(b), 10(c), 10(d), 10(e) and 10(f) are sectional schematic diagrams along line B-B showing manufacturing steps of the organic EL display panel.

(Substrate Preparing Step)

First, the substrate 11 is prepared. Specifically, for example, the TFT layer and the interlayer insulating layer are formed by forming necessary films over the base by a sputtering method, a chemical vapor deposition (CVD) method, a spin-coating method, and so forth and patterning the films by a photolithography method. At this time, treatment such as plasma treatment, ion implantation, and baking may be carried out according to need.

(Pixel Electrode Forming Step)

Next, the pixel electrodes 12 are formed on the substrate 11 and the pixel electrodes 12 are formed. Specifically, for example, first a metal film is formed on the substrate 11 by a vacuum evaporation method or a sputtering method. Next, the metal film is patterned by a photolithography method to line up plural pixel electrodes 12 in the column direction with the intermediary of intervals on the substrate 11 and juxtapose plural columns of such pixel electrodes 12. In this manner, the pixel electrodes 12 two-dimensionally arranged on the substrate 11 are formed.

(Underlying Layer Forming Step)

Figure 9A:
FIGS. 9(a), 9(b), 9(c), 9(d), 9(e) and 9(f) are sectional schematic diagrams along line A-A showing manufacturing steps of the organic EL display panel.
Figure 10A:
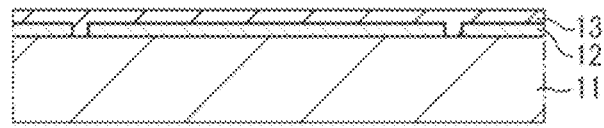
FIGS. 10(a), 10(b), 10(c), 10(d), 10(e) and 10(f) are sectional schematic diagrams along line B-B showing manufacturing steps of the organic EL display panel.

Next, as shown in FIG. 9(a) and FIG. 10(a), the underlying layer 13 is formed over the substrate 11 after the formation of the pixel electrodes 12. Specifically, for example, an oxide layer of a blanket film is deposited over the substrate 11 to cover all pixel electrodes 12 by a sputtering method.

(Second Partition Wall Forming Step)

Figure 9B:
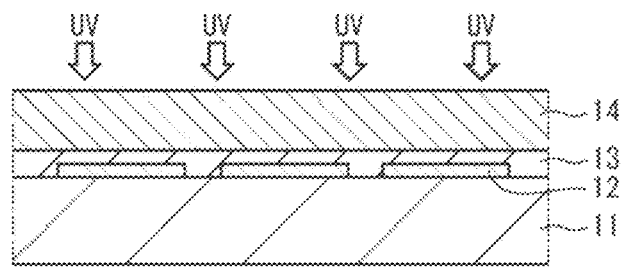
Figure 10B:
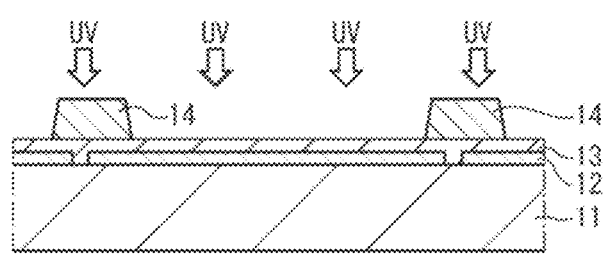

Next, as shown in FIG. 9(b) and FIG. 10(b), the second partition walls 14 are formed on the underlying layer 13. Specifically, for example, an inorganic insulating film (silicon oxide or the like) is formed on the underlying layer 13 by a CVD method. Then, the inorganic insulating film is patterned by a photolithography method and the second partition walls 14 having a linear shape are formed to extend along the row direction at such positions as to sandwich each of the rows of the pixel electrodes 12.

After the second partition walls 14 are formed, to enhance the lyophilicity of the second partition walls 14, first the second partition walls 14 are irradiated with UV from above and then baking treatment is carried out. In the present application, the UV irradiation and the baking treatment are not essential but optional. The condition of the UV irradiation is approximately 60 seconds to 180 seconds with use of a UV ozone cleaner (UV-1, made by SAMCO Corporation) for example. Furthermore, the condition of the baking treatment is approximately 10 minutes to 30 minutes at 200° C. to 250° C. for example.

Figure 9C:
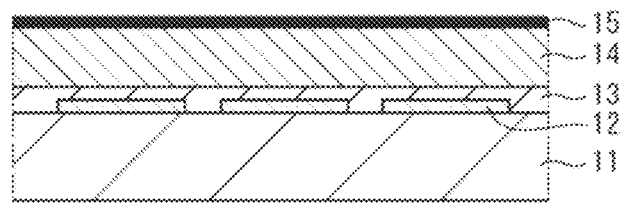
Figure 10C:
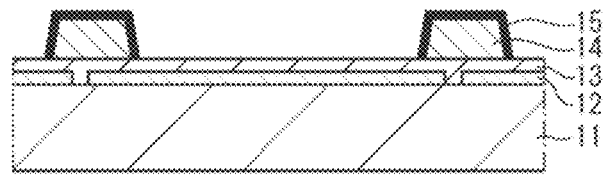

Next, as shown in FIG. 9(c) and FIG. 10(c), ink containing an application-type material of an organic functional layer is applied on the second partition walls 14 and the ink is dried to form the coats 15. Specifically, for example, the ink is applied on the underlying layer 13 and the second partition walls 14 by a spin-coating method. Then, patterning is carried out by a photolithography method to form the coats 15 only on the upper surfaces 14a and the side surfaces 14b of the second partition walls 14.

(First Partition Wall Forming Step)

Figure 9D:
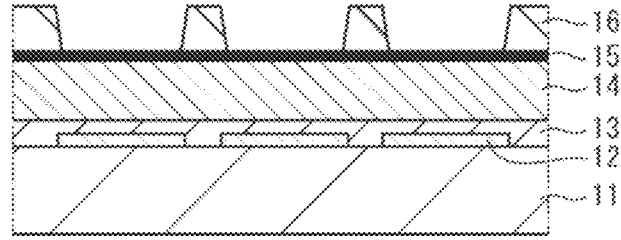
Figure 10D:

Next, as shown in FIG. 9(d) and FIG. 10(d), the first partition walls 16 are formed on part of the underlying layer 13 and on part of the second partition walls 14. Specifically, for example, a positive photosensitive organic material (acrylic-based resin or the like) is applied by a spin-coating method. At this time, the film thickness of the applied material is set larger than that of the second partition walls 14. Then, the photosensitive organic material is patterned by a photolithography method and the first partition walls 16 having a linear shape are formed to extend along the column direction at such positions as to sandwich each of the columns of the pixel electrodes 12.

The first partition walls 16 may be directly formed by a printing method or the like. Furthermore, surface treatment by an alkaline solution, water, an organic solvent, plasma, or the like may be carried out for the first partition walls 16 to give the surfaces of the first partition walls 16 lyophobicity with respect to ink to be applied in a subsequent step. This can suppress the flow of the ink over the first partition walls 16 in the subsequent light emitting layer forming step.

By this step, the gaps 20 between the adjacent first partition walls 16 are formed and the columns formed by the pixel regions 21 and the inter-pixel regions 22 each exist in the gap 20.

(Light Emitting Layer Forming Step)

Figure 9E:
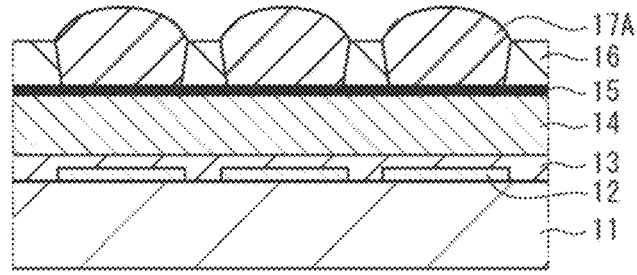
Figure 10E:
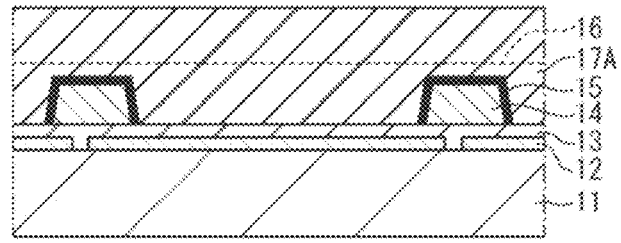

Next, as shown in FIG. 9(e) and FIG. 10(e), ink 17A is applied into the gaps 20. Specifically, for example, the ink 17A is fabricated by mixing an organic compound serving as the material of the light emitting layers 17 and a solvent at a predetermined ratio and this ink 17A is applied into the gaps 20 by using an inkjet method. By applying the ink 17A in such a manner that the upper surface of the ink 17A becomes higher than the upper surfaces 14a of the second partition walls 14, the flow of the ink 17A over the second partition walls 14 is enabled. Then, the solvent contained in the ink 17A is evaporated and dried to form the light emitting layers 17. As the application method of the ink 17A, a dispenser method, a nozzle-coating method, a spin-coating method, a printing method, or the like may be used.

Furthermore, in the present embodiment, the light emitting layers 17 have the pixel regions 21 of three colors of red, green, and blue and therefore are formed by using the inks 17A different from each other. Specifically, for example, there are a method in which the inks 17A of the three colors are sequentially applied by using a nozzle (discharge port) that discharges only the ink 17A corresponding to one of red, green, and blue, a method in which the inks 17A of the three colors are simultaneously applied by using a triple nozzle that can simultaneously discharge the inks 17A corresponding to the respective colors of red, green, and blue, and so forth.

Furthermore, because of the panel 10 employing the line banks, a method is preferable in which plural nozzles that discharge only the ink 17A of the same color are lined up in the column direction and the light emitting layers 17 are formed by discharging the ink 17A into the gaps 20 with the movement of the plural nozzles in a direction intersecting the column direction. According to this method, first, because the plural nozzles are used, the application time of the ink 17A becomes shorter and the step can be shortened. Next, the ink 17A discharged from the plural nozzles is linked in the column direction in the gap 20. Thus, even when the amount of discharge of the ink 17A in each nozzle varies, subsequently the ink 17A can flow in the column direction and the amount of application is leveled. This can reduce the occurrence of film thickness unevenness among the pixel regions 21, i.e. luminance unevenness.

Figure 9F:
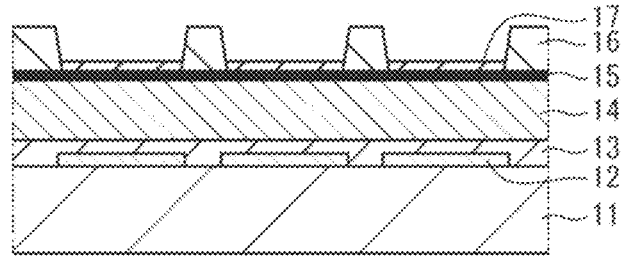
Figure 10F:
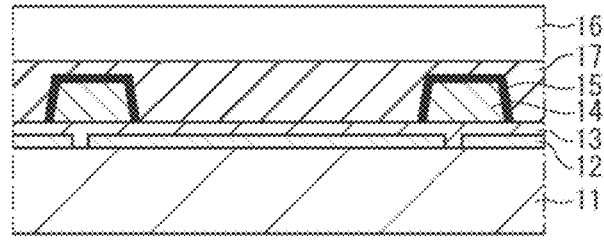

When the applied inks 17A dry, the light emitting layers 17 are formed in the gaps 20 as shown in FIG. 9(f) and FIG. 10(f). In the gaps 20, the light emitting layers 17 having a linear shape can be formed across the pixel regions 21, in which the underlying layer 13 that is not covered by the second partition wall 14 exists, and the inter-pixel regions 22, in which the second partition wall 14 and the coat 15 exist.

(Counter Electrode Forming Step)

Thereafter, the counter electrode 18 is formed along the upper surface 17a of each light emitting layer 17 and the surface of each first partition wall 16 exposed from the light emitting layers 17. Specifically, for example, by a vacuum evaporation method, a sputtering method, or the like, a film composed of an optically-transparent, electrically-conductive material such as ITO and IZO is formed along the upper surface 17a of each light emitting layer 17 and the surface of each first partition wall 16 exposed from the light emitting layers 17.

(Sealing Layer Forming Step)

Next, the sealing layer 19 that covers the upper surface of the counter electrode 18 is formed. Specifically, for example, an inorganic insulating film (silicon oxide or the like) is formed on the counter electrode 18 by a sputtering method or a CVD method.

In the above-described manner, the panel 10 is completed.

MODIFICATION EXAMPLES

In embodiment 1, the panel 10 according to one aspect of the present invention is described. However, the present invention is not subjected to any limitation by the above embodiment except for the essential characteristic constituent elements thereof. For example, modes obtained by making various kinds of modifications conceived by those skilled in the art on the respective embodiments and modes implemented by arbitrarily combining constituent elements and functions in the respective embodiments without departing from the gist of the present invention are also included in 16the present invention. In the following, modification examples of the panel 10 will be described as one example of such modes.

Modification Example 1

A panel according to modification example 1 is different from the panel 10 according to embodiment 1 in that a coat is formed also between the underlying layer and the light emitting layer in the pixel regions. Regarding the other configuration, the panel according to modification example 1 is basically the same as the panel 10 according to embodiment 1. Therefore, only the above-described difference will be described and description about the other configuration will be omitted.

Figure 11:
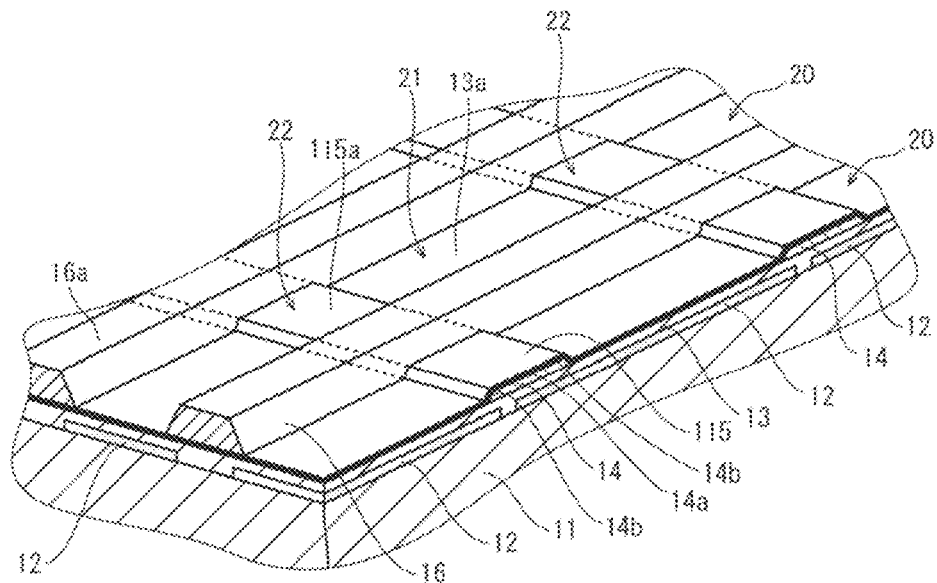
FIG. 11 is a schematic perspective view for explaining a coat according to modification example 1.

FIG. 11 is a schematic perspective view for explaining the coat according to modification example 1. As shown in FIG. 11, a coat 115 is formed in the gaps 20 between the adjacent first partition walls 16 across plural pixel regions 21 lined up in the column direction. More specifically, the coat 115 is formed not only in each pixel region 21 in the same gap 20 but also in each inter-pixel region 22 existing between the adjacent pixel regions 21. Moreover, the coat 115 is formed also under the first partition walls 16. That is, the coat 115 is formed as a blanket film over the whole of the substrate 11. Thus, the coat 115 is not only formed on the whole of the second partition walls 14 but also formed on the upper surface 13a of the underlying layer 13 between the adjacent second partition walls 14.

The coat may be formed into a strip shape only in the gaps 20 between the first partition walls 16. That is, a configuration in which the coat is not formed under the first partition walls 16 may be employed.

The coat 115 has higher lyophilicity than the second partition wall 14. Therefore, an upper surface 115a of the coat 115 has higher lyophilicity than the upper surface 13a of the underlying layer 13. As the material to form the coat 115, the same material as the material of the coat 15 according to embodiment 1 can be used.

When such a configuration is employed, the wettability of the pixel regions 21 becomes identical to that of the inter-pixel regions 22 and thus luminance unevenness is further suppressed. Furthermore, minute patterning in forming the coat 115 is unnecessary and thus the manufacturing step can be simplified.

Modification Example 2

A panel according to modification example 2 is different from the panel 10 according to embodiment 1 in that a coat is formed only on the upper surfaces of the second partition walls. Regarding the other configuration, the panel according to modification example 2 is basically the same as the panel 10 according to embodiment 1. Therefore, only the above-described difference will be described and description about the other configuration will be omitted.

Figure 12:
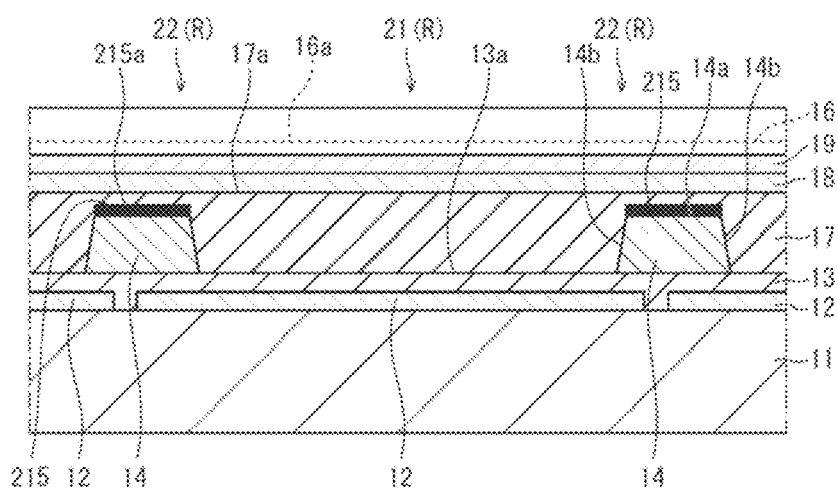
FIG. 12 is a sectional schematic diagram for explaining a coat according to modification example 2.

FIG. 12 is a sectional schematic diagram for explaining the coat according to modification example 2. As shown in FIG. 12, coats 215 are formed on the upper surfaces 14a of the second partition walls 14 but are not formed on the side surfaces 14b of the second partition walls 14. As just described, the coat 215 does not necessarily need to be formed on the whole of the second partition walls 14 (whole of the surfaces of the second partition walls 14 on the side of the light emitting layers 17) and it suffices for the coat 215 to be formed at least on the upper surfaces 14a of the second partition walls 14. This is because the discontinuity of ink on the upper side of the second partition walls 14 can be effectively suppressed if the coats 215 are formed on the upper surfaces 14a of the second partition walls 14.

Furthermore, although it is preferable for the coat 215 to be formed on the whole of the upper surface 14a of the second partition wall 14, the coat 215 does not necessarily need to be formed on the whole of the upper surface 14a and may be formed on part of the upper surface 14a.

The coat 215 has higher lyophilicity than the second partition wall 14. Therefore, an upper surface 215a of the coat 215 has higher lyophilicity than the upper surface 13a of the underlying layer 13. As the material to form the coat 215, the same material as the material of the coat 15 according to embodiment 1 can be used.

Also when such a configuration is employed, the wettability of the inter-pixel regions 22 is improved and thus luminance unevenness is suppressed. Furthermore, the amount of use of the material of the coat 215 can be reduced.

Other Modification Examples

In the above-described embodiment 1, the configuration in which only the underlying layer 13 and the light emitting layer 17 exist between the pixel electrode 12 and the counter electrode 18 is employed. However, the present invention is not limited thereto. For example, a configuration including a hole injection layer, a hole transport layer, an electron transport layer, an electron injection layer, and so forth or a configuration including plural layers among them or all of them at the same time may be employed. Furthermore, these layers do not need to be all composed of an organic compound and may be composed of an inorganic substance or the like.

Furthermore, in the above-described embodiment 1, there are three kinds of pixel regions as the pixel regions 21: the red pixel regions 21R, the green pixel regions 21G, and the blue pixel regions 21B. However, the present invention is not limited thereto. For example, the light emitting layer may be one kind of light emitting layer or the light emitting layer may be four kinds of light emitting layers that emit light in red, green, blue, and yellow.

In addition, in the above-described embodiment 1, the configuration in which the pixel regions 21 in the gap 20 all emit light of the same color is employed. However, the present invention is not limited thereto. For example, a configuration including the gaps 20 in which the red pixel regions 21R and the blue pixel regions 21B are alternately arranged and the green gaps 20G may be employed.

Moreover, in the above-described embodiment 1, the configuration in which the pixel regions 21 are arranged in a matrix manner is employed. However, the present invention is not limited thereto. For example, when the interval of the pixel regions is defined as one pitch, the present invention has the effect also for a configuration in which the pixel regions are displaced in the column direction by the half pitch between adjacent gaps. In the display panel, in which increase in the definition is being progressed, a certain amount of displacement in the column direction is difficult to discriminate in visual recognition. Thus, even when film thickness unevenness lies on a straight line having a certain amount of width (or in a staggered manner), the film thickness unevenness has a strip shape in visual recognition. Therefore, also in such a case, the display quality of the display panel can be improved by suppressing the lying of luminance unevenness in the above-described staggered manner.

Furthermore, in the above-described embodiment 1, the underlying layer 13 electrically insulates the pixel electrodes 12 lined up in the row direction from each other. However, the present invention is not limited thereto. For example, a layer that electrically insulates the pixel electrodes 12 lined up in the row direction from each other may exist under the underlying layer 13.

In addition, in the panel 1 according to the above-described embodiment 1, the pixel electrodes 12 are disposed in all gaps 20. However, the present invention is not limited to this configuration. For example, to form a busbar or the like, the gap 20 in which the pixel electrodes 12 are not formed may exist.

Moreover, in the above-described embodiment 1, the second partition walls 14 have such a shape as to be allowed to be differentiated from other constituent elements such as the underlying layer 13 and the first partition walls 16. However, the present invention is not limited thereto. For example, part of the underlying layer may be equivalent to the second partition wall. If part of another constituent element serves as the second partition wall, whether the part is the second partition wall may be determined relatively. For example, if the inter-pixel regions in the gap include the inter-pixel region higher than the other inter-pixel regions in the effect of restricting the flow of ink in the column direction due to difference from the other inter-pixel regions in the structure and properties such as the height from the upper surface of the substrate, the length in a direction intersecting the first partition wall, and lyophobicity, it is deemed that the second partition wall exists in this inter-pixel region. On the other hand, even when a part having a certain level of flow restriction effect like the underlying layer 13 according to the above-described embodiment 1 exists, the part is not immediately deemed as the inter-pixel region in which the second partition wall exists.

Furthermore, in the above-described embodiment 1, the configuration in which the panel 10 is a top-emission type is employed. However, it is also possible to employ a bottom-emission type. In this case, appropriate changes can be made regarding the respective configurations.

Moreover, in the above-described embodiment 1, the configuration in which the panel 10 is an active matrix type is employed. However, the present invention is not limited thereto and a configuration with a passive matrix type may be employed for example. Specifically, plural line-shaped electrodes parallel to the extension direction of the first partition walls and plural line-shaped electrodes orthogonal to the extension direction of the first partition walls may be juxtaposed to sandwich the light emitting layer. At this time, if the line-shaped electrodes orthogonal to the extension direction of the first partition walls are set on the lower side, the plural lower-side electrodes are lined up in the extension direction of the first partition walls at intervals from each other in each gap, which provides one aspect of the present invention. In this case, appropriate changes can be made regarding the respective configurations. In the above-described embodiment 1, the configuration in which the substrate 11 has the TFT layer is employed. However, as is understood from the example of the above-described passive matrix type and so forth, the substrate 11 is not limited to the configuration having the TFT layer.

[Embodiment 2]

In the following, an organic EL display device according to embodiment 2 as one aspect of the present invention will be described by using FIG. 13.

Figure 13:
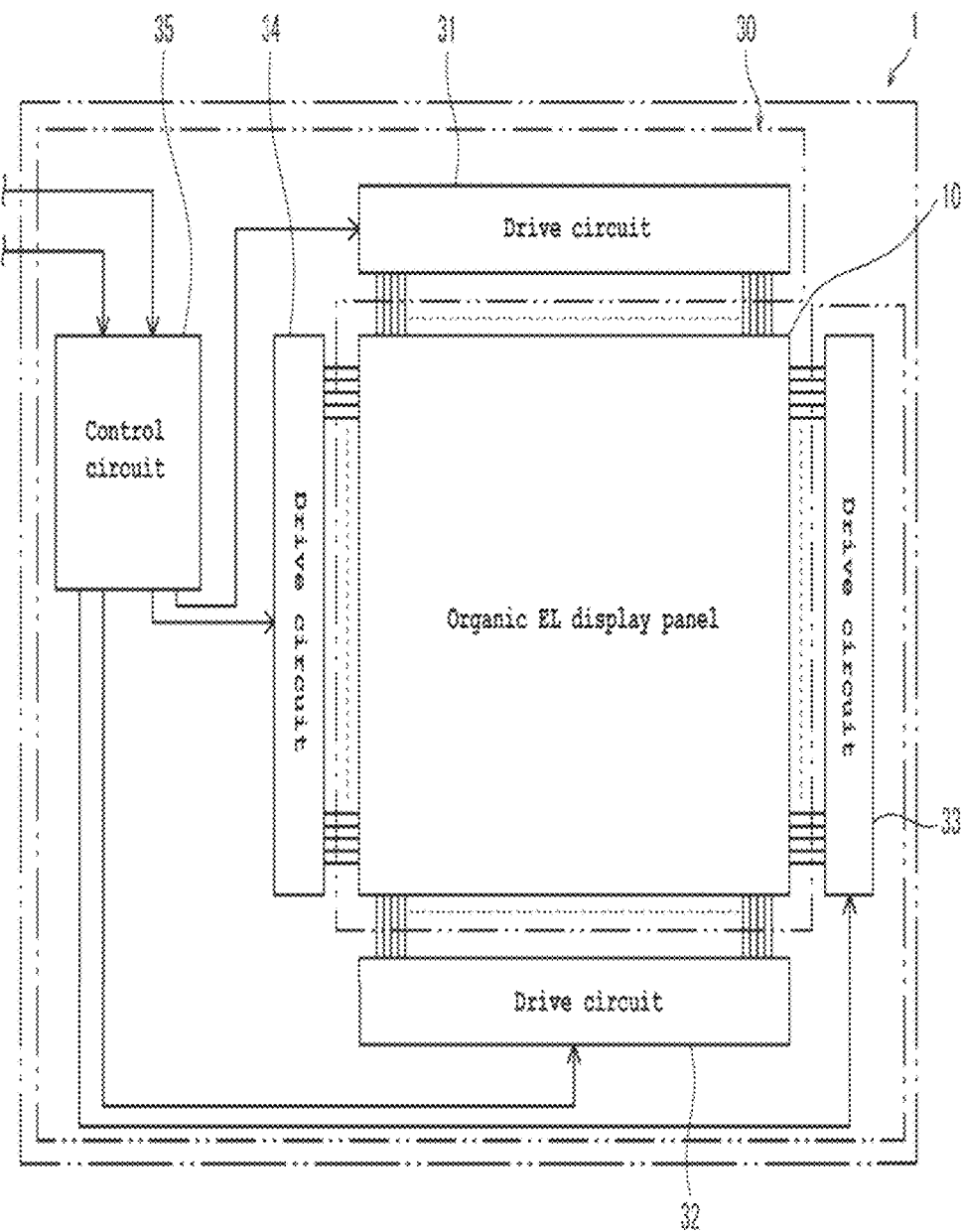
FIG. 13 is a block diagram showing the schematic configuration of an organic EL display device according to embodiment 2.

FIG. 13 is a block diagram showing the schematic configuration of the organic EL display device according to embodiment 2. As shown in FIG. 13, an organic EL display device 1 according to embodiment 2 is an organic EL display device including the panel 10 according to embodiment 1. Besides, the organic EL display device 1 has a drive control unit 30 connected to the panel 10.

The drive control unit 30 is composed of four drive circuits 31 to 34 and a control circuit 35. However, in the organic EL display device 1, the disposing of the drive control unit 30 for the panel 10 is not limited thereto.

In the case of displaying an image on the panel 10, on the basis of the active matrix system, voltage is applied to the predetermined pixel electrodes 12 through TFTs in the substrate 11 of the panel 10 by the drive circuits 31 to 34. As a result, current flows between the predetermined pixel electrodes 12 and the counter electrode 18 and the light emitting layers 17 in the pixel regions 21 corresponding to the predetermined pixel electrodes 12 emit light. Consequently, the panel 10 is allowed to display a colored image as a whole.

The organic EL display device 1 includes the panel 10 in which luminance unevenness is suppressed. Therefore, the organic EL display device 1 can realize high display quality.

INDUSTRIAL APPLICABILITY

The organic EL display panel and the organic EL display device according to the present invention can be widely used for devices such as television sets, personal computers, and mobile phones or other various pieces of electronic equipment having a display panel.

REFERENCE SIGNS LIST

1 Organic EL display device
10 Organic EL display panel
11 Substrate
13 Underlying layer
14 Second partition wall
14a Upper surface
15 Coat
16 First partition wall
16a Upper surface
17 Light emitting layer

What is claimed is:
1. An organic electro luminescence display panel, comprising:
  a substrate;
  an underlying layer on the substrate;
  a plurality of first partition walls on an upper side of the underlying layer, wherein each of the plurality of first partition walls extends along a first direction;
  a plurality of second partition walls on the upper side of the underlying layer, wherein each of the plurality of second partition walls extends along a second direction intersecting the first direction, and wherein each of the plurality of second partition walls has an upper surface at a position lower than upper surfaces of the plurality of first partition walls;
  a light emitting layer on the upper side of the underlying layer and in gaps between adjacent first partition walls of the plurality of first partition walls, wherein the light emitting layer covers the plurality of second partition walls; and a coat between the plurality of second partition walls and the light emitting layer.

2. The organic electro luminescence display panel according to claim 1, wherein the coat is on the upper surface of each of the plurality of second partition walls, wherein the coat has higher lyophilicity than the plurality of second partition walls.

3. The organic electro luminescence display panel according to claim 2, wherein the coat has one of higher lyophilicity than the underlying layer or has lyophilicity comparable to lyophilicity of the underlying layer.

4. The organic electro luminescence display panel according to claim 1, wherein the coat is continuously formed on the plurality of second partition walls and on the underlying layer along the first direction in the gaps.

5. The organic electro luminescence display panel according to claim 1, wherein the coat is formed on the plurality of second partition walls in the gaps.

6. The organic electro luminescence display panel according to claim 1, wherein the light emitting layer is formed by application of ink containing an organic material into the gaps, and wherein a contact angle of an upper surface of the coat with respect to the ink is equal to or smaller than 3°.

7. The organic electro luminescence display panel according to claim 1, wherein the light emitting layer extends along the first direction.

8. The organic electro luminescence display panel according to claim 1, wherein the underlying layer contains tungsten oxide.

9. The organic electro luminescence display panel according to claim 1, wherein an upper surface of the light emitting layer is higher than the upper surface of each of the plurality of second partition walls.

10. The organic electro luminescence display panel according to claim 1, wherein each of the plurality of second partition walls has an electrical insulation property.

11. An organic electro luminescence display device, comprising:
    an organic electro luminescence display panel, comprising:
        a substrate;
        an underlying layer on the substrate;
        a plurality of first partition walls on an upper side of the underlying layer,
    wherein each of the plurality of first partition walls extends along a first direction;
        a plurality of second partition walls on the upper side of the underlying layer, wherein each of the plurality of second partition walls extends along a second direction intersecting the first direction, and wherein each of the plurality of second partition walls has an upper surface at a position lower than upper surfaces of the plurality of first partition walls;
        a light emitting layer on the upper side of the underlying layer and in gaps between adjacent first partition walls of the plurality of first partition walls, wherein the light emitting layer covers the plurality of second partition walls; and
        a coat between the plurality of second partition walls and the light emitting layer.

12. An organic electro luminescence display panel, comprising:
    a substrate;
    an underlying layer on the substrate;
    a plurality of first partition walls on an upper side of the underlying layer, wherein each of the plurality of first partition walls extends along a first direction;
    a plurality of second partition walls on the upper side of the underlying layer, wherein each of the plurality of second partition walls extends along a second direction intersecting the first direction, and wherein the plurality of second partition walls has upper surfaces at a position lower than upper surfaces of the plurality of first partition walls;
    a coat at least on the upper surfaces of the plurality of second partition walls; and
    a light emitting layer on the upper side of the underlying layer and in gaps between adjacent first partition walls of the plurality of first partition walls, wherein the light emitting layer covers the plurality of second partition walls.

13. The organic electro luminescence display panel according to claim 12, wherein the coat has higher lyophilicity than the plurality of second partition walls.

* * * * *